United States Patent [19]

Pfaff

[11] Patent Number: 4,950,980

[45] Date of Patent: Aug. 21, 1990

[54] TEST SOCKET FOR ELECTRONIC DEVICE PACKAGES

[76] Inventor: Wayne K. Pfaff, 309 Steeplechase, Irving, Tex. 75062

[21] Appl. No.: 225,869

[22] Filed: Jul. 29, 1988

[51] Int. Cl.$^5$ ............................ G01R 1/02; G01R 1/04
[52] U.S. Cl. .................................... 439/296; 324/72.5; 324/158 F; 324/158 P; 439/296
[58] Field of Search ............. 324/72.5, 73 PC, 158 P, 324/158 F; 439/262, 264, 296, 347

[56] References Cited

U.S. PATENT DOCUMENTS

| | | | |
|---|---|---|---|
| 3,348,146 | 10/1967 | Freund et al. | 324/158 F |
| 4,047,780 | 9/1977 | Cedrone | 324/158 F |
| 4,068,170 | 1/1978 | Chayka | 324/158 F |
| 4,405,191 | 9/1983 | Fettig | 324/158 F |
| 4,547,960 | 10/1985 | Di'Troia | 324/158 F |
| 4,774,462 | 9/1988 | Black | 324/158 F |

FOREIGN PATENT DOCUMENTS 0141363  4/1980  German Democratic Rep. ............... 324/158 F

OTHER PUBLICATIONS

"Semiconductor Test Handler", by Abraham Western Electric Tech. Dig. 7/78, #51, pp. 1-2.

Primary Examiner—Reinhard J. Eisenzopf
Assistant Examiner—W. Burns
Attorney, Agent, or Firm—Kanz, Scherback & Timmons

[57] ABSTRACT

A socket having an array of terminals adapted for insertion into a burn-in board is adapted to interconnect respective pins of a high pin density integrated circuit package to the terminals. The socket includes a lid with an array of holes for receiving the pins and registering the pins with underlying terminal openings and a cam mechanism actuable to move the lid relative to the terminals to cause the pins to make contact with the terminals within the openings. Mounting of the package on the socket and insertion of the pins into underlying terminal openings is accomplished with zero insertion force applied to the pins. Actuation of the cam mechanism causes the pins to contact respective terminals without deforming the pins.

2 Claims, 3 Drawing Sheets

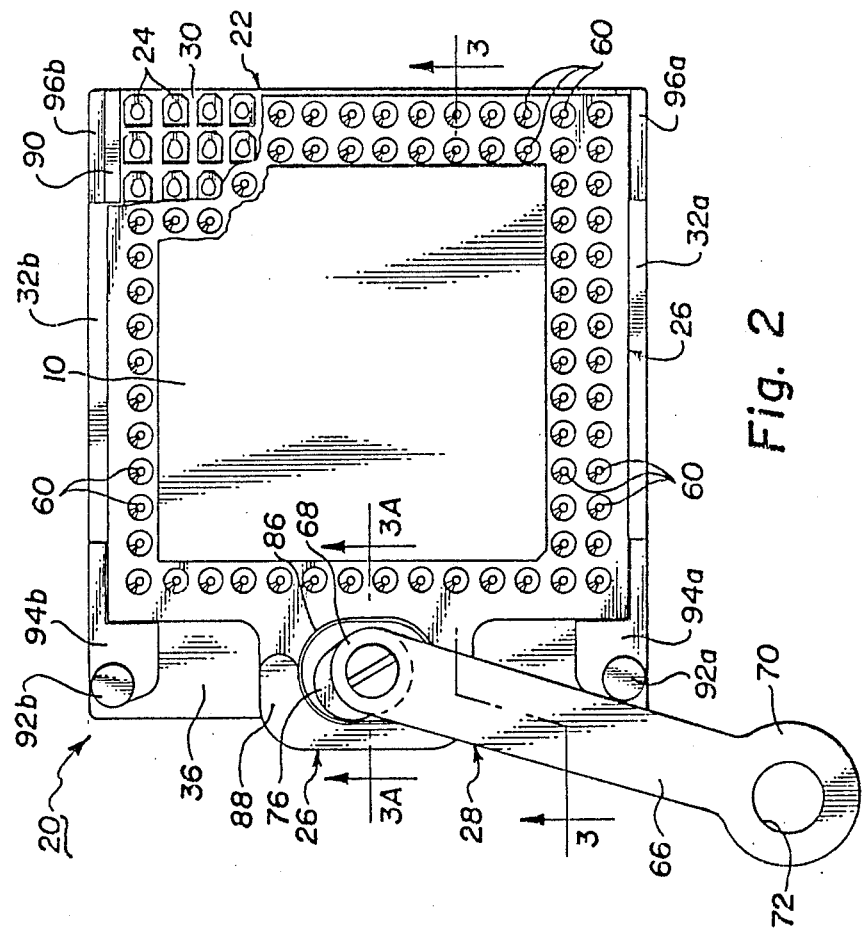
Fig. 2
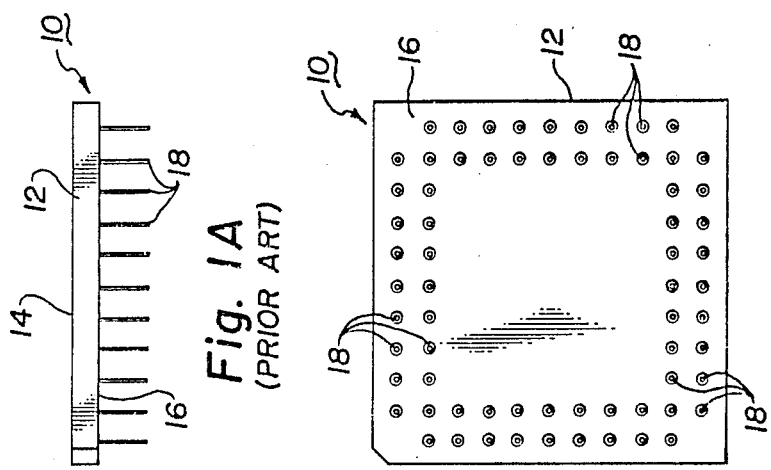
Fig. 1A (PRIOR ART)
Fig. 1B (PRIOR ART)

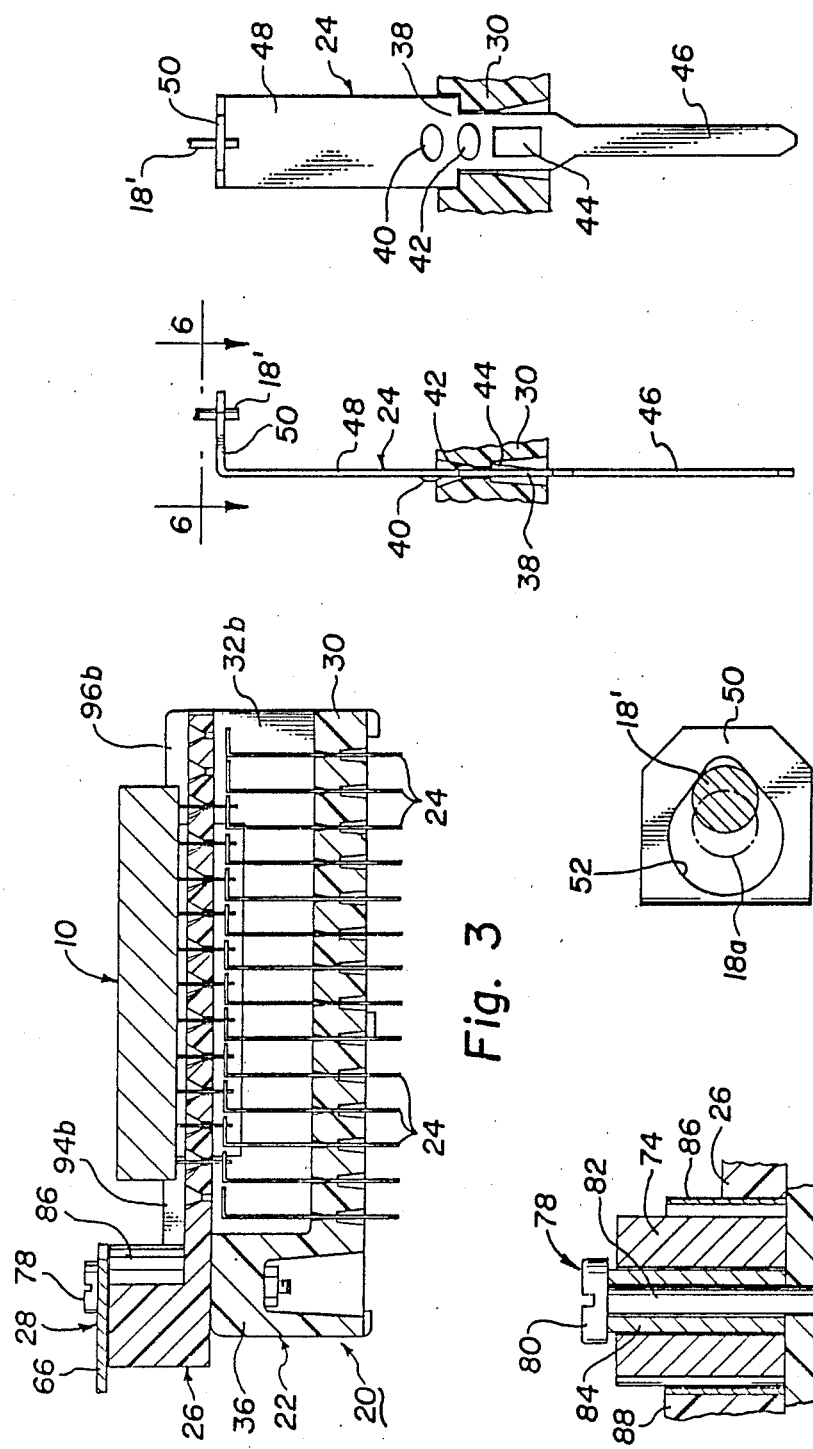

TEST SOCKET FOR ELECTRONIC DEVICE PACKAGES

Traditional dual-in-line packages (DIPs) have rectangular plastic or ceramic bodies which encapsulate integrated circuit chips or devices. Such DIPs have a limited number of leads or pins which can be deployed externally from an integrated circuit package. A principal reason for such pin density restriction is that such traditional DIP packages have only one row of pins extending from each of the two longer sides of the rectangular DIP body. The need for a higher number of external pins and minimal area utilization for certain integrated circuit devices such as gate arrays has led to packages with denser pin configurations.

One such integrated circuit package has a square or rectangular body with multiple rows of pins extending downward from a major surface and along all four edges of the package. The development of such packages has created the need for test sockets for receiving the pins of such packages to make pressure contact therewith so that the integrated circuit therein may be tested prior to permanent installation of the package by soldering to a printed circuit board in the conventional manner.

The present invention addresses the problems particularly associated with handling and testing of such high pin density integrated circuit packages. A major problem with such high density pins is their tendency to be deformed inadvertently during handling and testing, leaving them out of proper position for mounting by insertion of the pins through holes in a printed circuit board. In accordance with the present invention, a test socket is provided for receiving the integrated circuit package and making pressure contact to the pins without damage or bending of the pins during diagnostic testing.

Various advantages and features of the present invention will become more readily understood upon consideration of the presently preferred embodiment of the test socket described in conjunction with the accompanying drawing wherein:

FIG. 1A is a side elevational view of an electronic device package of the type used with the inventive test socket;

FIG. 1B is a bottom plan view of the electronic device package of FIG. 1A showing a typical pin configuration;

FIG. 2 is a plan view of a preferred embodiment of the inventive test socket with the electronic device package mounted therein and with portions broken away to illustrate underlying features;

FIG. 3 is a cross-sectional view of the test socket shown in FIG. 2 taken along line 3—3;

FIG. 3A is an enlarged cross-sectional view taken along line 3A—3A of FIG. 2;

FIG. 4 is a side elevational view of one of a plurality of similar terminals used in the inventive test socket;

FIG. 5 is a front elevation view of the terminal of FIG. 4;

FIG. 6 is a plan view of a head portion of the terminal shown in FIG. 4 with a pin of the electronic device package shown in cross-section is viewed from line 6—6 of FIG. 4.

Figure 7A:
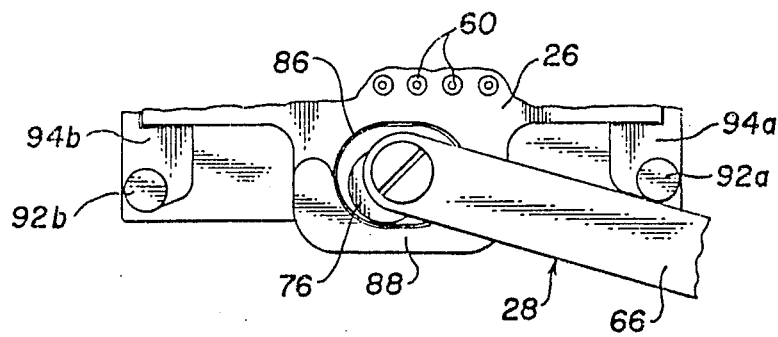
FIGS 7A–7C are plan views of a rearward end portion of the test socket showing a cam element and arm in three different positions.

With reference to FIGS. 1A and 1B, a conventional electronic device package is indicated generally by reference numeral 10. The package 10 has a square or generally rectangular body 12 with flat upper and lower surfaces 14 and 16, respectively. A plurality of conductive pins, representative ones of which are designated by reference numeral 18, extend downward from the lower surface 16. The pins 18 are interconnected in a conventional manner with an integrated circuit chip (not shown) encapsulated within the body 12. The package 10 has a total of sixty-eight pins disposed in two rows around the periphery of the package as seen in the view of FIG. 1B. It will be appreciated that the pin configuration shown is one of many different arrangements commercially available from electronic device manufacturers. As will be seen from the following description, the present invention is capable of receiving, or may be adapted to receive, any of various pin configurations of the high density type typified in FIG. 1B.

With reference to FIGS. 2 and 3, a test socket in accordance with the present invention is indicated generally by reference numeral 20. The test socket 20 comprises a frame 22, an array of terminals 24 mounted in the frame, a lid 26 slidably supported on the frame, and a cam mechanism 28 mounted on the frame and cooperating with the lid in a manner described in detail below. The frame 22 has a generally rectangular base 30, thin sidewalls 32a and 32b extending up from opposite sides of the base and a thick endwall 36 extending up from a rearward end of the base and interconnecting the sidewalls. The frame 22 and lid 26 may be manufactured using conventional plastic molding techniques.

Briefly referring to FIGS. 4 and 5, a representative one of the array of the terminals 24 will be described. Each terminal 24 has a central portion 38 which is secured in the base 30 by means of protrusions 40 and 42 and a tab 44 engaging mating surfaces within the base 30 in the manner shown. The terminal 24 has a stud portion 46 extending below the base for insertion into a printed circuit board (not shown), a blade portion 48 extending above the base and a head 50 bent at right angles to the blade at the upper end thereof.

The head 50 has a pear-shaped opening 52 seen clearly in FIG. 6. One pin 18' of the package 10 is shown extending through the opening 52 in contact with two edges of the head 50 within the pointed portion of the opening 52. When the pin is initially inserted into the opening 52, it is located approximately in the center of the opening as indicated by the phantom lines designated 18a. The pin is later urged into the position designated 18' to come into contact with the head 50 as will be described more fully below.

Referring again to FIGS. 2 and 3, the lid 26 has an array of holes, representative ones of which are designated by reference numeral 60. In the embodiment shown there are one hundred ninety-six holes in a fourteen-by-fourteen array. However, various other numbers and arrangements of holes are contemplated by the invention. As illustrated, an array of one hundred ninety-six terminals housing a terminal 24 corresponding to each hole 60 is also shown. However, it is ordinarily not necessary to have a full array of terminals and some lesser number will suffice. For example, in an alternative to the embodiment shown, an array of sixty-eight terminals corresponding to the pin configuration of the package 10 would suffice. Alternatively, a composite array of terminals can be installed in the base 30 to adapt the socket 20 to several different pin configurations (not shown) of other commercially available electronic device packages.

When the device 10 is mounted on the lid 26, the pins 18 extend through the holes 60 in the lid and down into openings 52 in corresponding terminals 24. The fourteen-by-fourteen array of holes 60 can readily accommodate a variety of different packages like the package 10 having different pin arrangements. Accordingly, it will be appreciated that test sockets of the present invention can be manufactured for use with an electronic device package having a particular pin configuration or for a variety of electronic device packages having different pin configurations.

The cam mechanism 28, seen most clearly in FIG. 2, has an arm 66 having a first end 68 pivotally mounted at the center of the endwall 36. The arm 66 has a second end or free end 70 rotatable about the first end. The free end 70 includes a hole 72 to facilitate operation of the arm by automated equipment (not shown). The pivot end 68 has a central neck 74 (see FIG. 3A) and a cam 76 extending outward from the neck at an angle preferably of about 125° relative to the arm 66. The arm 66, neck 74 and cam 76 preferably comprise a single stainless steel member. A fastener 78 having a head 80 and a shaft 82 secures the cam mechanism 28 to the endwall 36 in the manner shown. The shaft extends through an opening in the neck 74 and defines the axis of rotation of the cam mechanism 28. A bushing 84 surrounds the shaft 82 as seen in FIG. 3A and serves to locate the head 80 at a height above the endwall 36 slightly greater than the height of the neck 74 and cam 76, thereby permitting the neck to rotate freely about the bushing 84. An oval-shaped sleeve 86, preferably of stainless steel, fits snugly within a similarly shaped opening in the rearward end of the lid 26. The sleeve 86 provides a surface against which the cam 76 operates to prevent wearing of the working surfaces.

The lid 26 has a raised shoulder 88 located at a height above the rearward end 36 of the frame 22 such that the underside of the arm 66 slides across the shoulder 88 when the arm rotates. This feature tends to hold the lid 22 in place against the frame 22 as the lid slides back and forth. The underside of the lid 26 at the forward corners slides on shelves 90 (one of which is seen in FIG. 2) formed at the forward ends of the sidewalls 32a and 32b. Posts 92a and 92b extend above the endwall 36 to provide stops against movement of the arm 66 as will be described below with reference to FIGS. 7A-C. The frame includes plateaus 94a and 94b which serve to guide the rearward corners of the lid 26 and stop the rearward movement of the lid in the position shown in FIG. 2. The sidewalls 32a and 32b have thin strips 96a and 96b extending upward from the respective forward ends of the sidewalls to guide the sliding movement of the forward corners of the lid 26.

The socket 20 is typically one of many such sockets installed on a printed circuit board (not shown) used for burn-in of integrated circuit devices in a manner well known in the art. Typically, the electronic device package 10 is also one of many such packages containing integrated circuits to be tested simultaneously. Testing is accomplished by mounting packages in predetermined positions in sockets in the manner exemplified in FIGS. 2 and 3. The package 10 is mounted so that its pins 18 pass through predetermined holes 60 and extend down into corresponding openings 52 in underlying terminals 24. The cam mechanism 28 is then actuated either manually or automatically to cause the pins 18 to make contact with respective terminals 24. Once testing of the package 10 is complete, the cam mechanism is opened to release the contacting force on the pins 18 allowing the package 10 to be removed from the socket 20. It will be appreciated that the mounting and removal of the package 10 is accomplished with zero force on the pins 18.

Figure 7B:
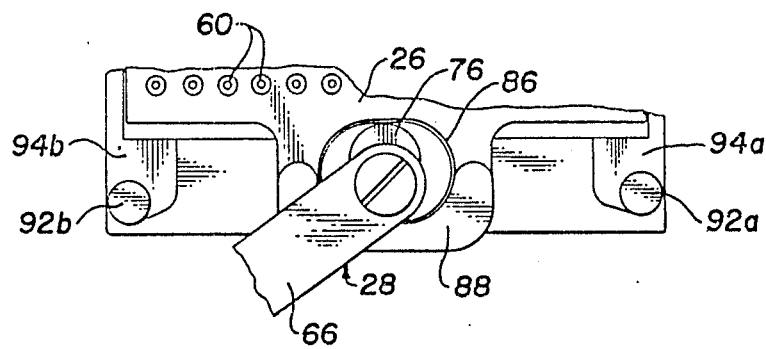
Figure 7C:
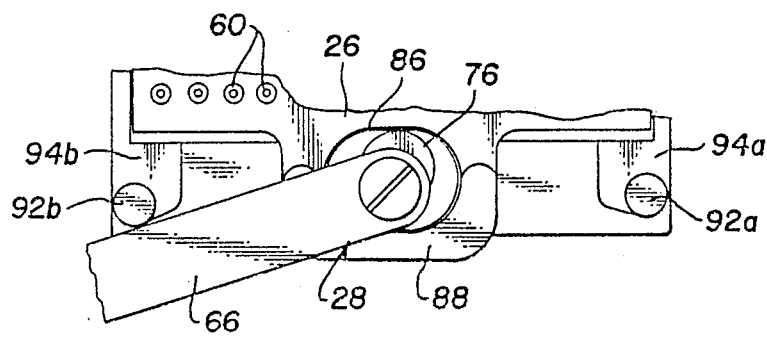

With reference to FIGS. 7A-C, the operation of the socket 20 will now be described in detail. FIG. 7A shows the arm 66 in an open or first rest position (the same position as shown in FIG. 2) wherein the arm 66 is rotated as far as it can go in a counterclockwise direction where it abuts the post 92a. In this position the cam 76 pulls the lid 26 rearward until the rearward corners abut or nearly abut the plateaus 94a and 94b. With the lid in this position, the holes 60 are aligned above the corresponding openings 52 in the underlying terminals 24 so that a package 10 can be mounted on the lid 26 with the pins 18 extending through the holes 60 and into corresponding openings 52 therebelow. With the arm 66 in the first rest position, each pin will be in approximately the position relative to the terminal head 50 shown by the phantom lines 18a in FIG. 6.

In order to move the pins 18 into contact with respective terminals 24, the arm 66 is rotated clockwise causing the cam 76 to push the lid forward. When the arm 66 reaches the intermediate position (shown in FIG. 7B) the cam 76 is extending in the maximum forward direction causing the lid 26 to force the pins 18 into contact with the respective terminal heads 50. The pins 18 make good contact with the heads 50 by brushing the surfaces of the openings 52 as typified by the manner in which pin 18' makes contact at two points with the head 50 as seen in FIG. 6. The terminals 24 are designed to bend slightly forward when the lid 26 is in its maximum forward position shown in FIG. 7B.

When the arm is rotated further clockwise to a closed or second rest position against post 92b (as shown in FIG. 7C) the cam 76 is positioned to allow the lid 26 to slide slightly rearward in response to the slight spring action of the terminals 50. It will be appreciated that the forward-and-slight-return action described enables good contact to be maintained between all the pins 18 and the corresponding terminal heads 50.

The full range of movement of the arm 66 is preferably about 145° from the open position of FIG. 7A to the closed position of FIG. 7C. Movement of the arm 66 from the intermediate position of FIG. 7B to the closed position preferably describes an arc of about 17.5°. It has been found that the spring force of the terminals 24 working against the pins 18 is sufficient to urge the lid 26 rearward with enough force to hold the arm 66 against the post 92b. Accordingly, minor vibrations do not pause the arm 66 to swing open once a package 10 is secured in the socket 20 and the arm 66 is moved to the closed position shown in FIG. 7C.

From the foregoing description, it will be apparent that the present invention provides a needed solution to the problem of providing a practical test socket for high pin density integrated circuit packages. Although a preferred embodiment of the invention has been described in detail, it will be understood that various changes, substitutions and alterations can be made therein without departing from the spirit and scope of the invention as defined by the appended claims.

What is claimed:

1. A socket for testing an electronic device package, said socket comprising:

(a) a frame;

(b) terminals formed of resilient material secured in said frame;

(c) mounting means supported by said frame and movable relative to said terminals for carrying an electronic device package and aligning pins of the package proximate to edges of corresponding terminals; and (d) a cam mechanism rotatable from an open position to a closed position, wherein pins of an electronic device package carried by the mounting means are proximate to the corresponding terminal edges when the cam mechanism is in the open position and wherein the pins are in contact with corresponding terminal edges when the cam mechanism is in the closed position, and wherein said terminals bend from a rest state to a flexed state as the pins are forced into contact with the terminals so that the terminals provide a force in the flexed state tending to hold the cam mechanism in the closed position.

2. A socket for an electronic device package having a flat generally rectangular body and a plurality of conductive pins extending downwardly from a lower major surface of the body, said socket comprising:

(a) a frame having a generally rectangular base and walls at the periphery of said base;

(b) an array of terminals extending through said base, each terminal having a portion secured in said base, a stud extending below said base for insertion into a circuit board, a flexible blade extending above said base and a head at the upper end of the blade, the head including a opening for receiving a pin of an electronic device package;

(c) a lid slidably supported by the walls of said frame above said array of terminals, said lid having an array of holes, at least some of said holes being aligned above corresponding openings in the underlying heads of the terminals; and (d) cam means for urging the lid from a first position in which the contents of the holes in the lid are substantially aligned with the centers of the underlying openings of the heads to a second position in which the holes are offset from the centers of the underlying openings so that the pins of an electronic device package, when inserted through the holes of the lid while in the first position, are forced against the edges of the corresponding openings in the heads to make electrical contact therewith as the lid is urged into the second position by the cam means, said cam means including:

(i) an arm rotatable in a plane substantially parallel with the plane of movement of the lid, the arm being rotatable from an open position corresponding to the first lid position to a closed position corresponding to the second lid position;

(ii) a cam connected to said arm for forcing said lid rearward and forward relative to said frame in response to movement of said arm; and (iii) means for stopping the movement of said arm in the closed position to maintain contact between the pins and corresponding terminals, wherein said cam is positioned to force the lid forward to a maximum extent when the arm is in an intermediate position between the open and closed positions thereby flexing said terminals and creating a counteracting force tending to urge the lid rearward, whereby the position of said cam in the closed position retains the lid in a position such that the terminals continue to urge the lid rearward to apply a slight rotational force to the cam means tending to hold the arm against the stopping means.

* * * * *

UNITED STATES PATENT AND TRADEMARK OFFICE
CERTIFICATE OF CORRECTION

PATENT NO. : 4,950,980
DATED : August 21, 1990
INVENTOR(S) : Wayne K. Pfaff

It is certified that error appears in the above-identified patent and that said Letters Patent is hereby corrected as shown below:

Column 1, before line 5, insert ---This invention relates to pre-installation handling systems for testing electronic device packages. More particularly, it relates to test sockets for receiving integrated circuit packages and temporarily interconnecting their pins with certain test circuitry.---

Column 1, line 64, change "is" to ---as---
Column 3, line 42, change "22" (first occurrance) to ---26---
Column 3, line 49, after "frame" insert ---22---
Column 4, line 54, change "pause" to ---cause---
Column 6, line 4, change "contents" to ---centers---

Signed and Sealed this

Twenty-sixth Day of November, 1991

*Attest:*

HARRY F. MANBECK, JR.

*Attesting Officer*  *Commissioner of Patents and Trademarks*